(12) United States Patent
Kay et al.

(10) Patent No.: US 6,844,891 B1
(45) Date of Patent: Jan. 18, 2005

(54) ALIGNING IN FIVE DEGREES OF FREEDOM A MULTICHANNEL LASER PRINTHEAD FOR TRANSFERRING OLED MATERIAL

(75) Inventors: David B. Kay, Rochester, NY (US); Andrea S. Rivers, Bloomfield, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/615,131

(22) Filed: Jul. 8, 2003

(51) Int. Cl.[7] .............................................. B41J 2/435
(52) U.S. Cl. ........................................ 347/234; 347/248
(58) Field of Search ................................. 347/116, 234, 347/241, 248, 256; 355/53

(56) References Cited

U.S. PATENT DOCUMENTS

| 4,629,313 A | * 12/1986 | Tanimoto ...................... 355/53 |
| 5,323,179 A | 6/1994 | Sanger et al. ................ 347/237 |
| 6,249,300 B1 | 6/2001 | Kerr et al. ................... 347/198 |
| 6,362,847 B1 | 3/2002 | Pawley et al. .............. 347/234 |

* cited by examiner

*Primary Examiner*—Hai Pham
(74) *Attorney, Agent, or Firm*—Raymond L. Owens (57) ABSTRACT

A method and apparatus for aligning in five degrees of freedom a multichannel laser printhead to be used in thermal transfer of material from a donor to a substrate is disclosed.

13 Claims, 8 Drawing Sheets

ALIGNING IN FIVE DEGREES OF FREEDOM A MULTICHANNEL LASER PRINTHEAD FOR TRANSFERRING OLED MATERIAL

FIELD OF THE INVENTION

The present invention relates to organic light-emitting display devices and, in particular, to methods of aligning, maintaining, and calibrating a multichannel laser printhead used in manufacturing organic light-emitting diodes (OLEDs).

BACKGROUND OF THE INVENTION

OLEDs are useful in a variety of applications as discrete light-emitting devices, or as the active element of light-emitting arrays or displays, such as flat-panel displays in watches, telephones, digital cameras, laptop computers, pagers, cellular phones, calculators, and the like.

Conventional OLED display structures are built on glass substrates in a manner such that a two-dimensional OLED array for image manifestation is formed. Each OLED in the array generally includes overlying layers, starting with a light-transmissive first electrode formed on the substrate, an organic electroluminescent (EL) emission medium deposited over the first electrode, and a metallic electrode on top of the organic electroluminescent medium. When an electrical potential is placed across the electrodes, holes and electrons are injected into the organic zones from the anode and cathode, respectively. Light emission results from hole-electron recombination within the device.

One technical challenge relating to OLED technology is fabrication. Well known shadow mask-based vacuum deposition technology, using conventional vacuum chambers, is often used for manufacturing OLEDs. However, shadow mask-based vacuum deposition technology is limited in the precision of the deposition geometry. A laser thermal transfer (LTT) process is an example of an emerging thermal transfer deposition technology for manufacturing OLEDs with potential advantages over conventional deposition processes. LTT is a process that uses heat to transfer organic materials from a donor to a substrate. More specifically, a laser beam generates heat by impinging upon the donor, thereby vaporizing the material and depositing it upon the target substrate in a predefined pattern. Several technical challenges exist for manufacturing OLEDs using the LTT process, such as initial setup, maintenance, and calibration of a printhead, especially a multichannel laser printhead.

For example, U.S. Pat. No. 6,362,847 describes how the write lines of a color laser printer are maintained substantially equal throughout the printer's operation by an electronic control arrangement. At the factory, the write lines on all photoconductors of the color laser printer are calibrated to be substantially equal, and the ratio of each write line to a measuring line for each photoconductor is ascertained. During operation of the printer, the length of each of the measuring lines is periodically determined through counting the number of PELslice clock timing pulses produced from a PELslice clock operating at a fixed frequency determined during factory calibration. While U.S. Pat. No. 6,362,847 describes a suitable method of calibrating a laser printer, it does not provide a process for initial setup, maintenance, and calibration of a multichannel laser printhead in an LTT process for manufacturing OLED display devices.

It is therefore an object of the invention to provide a system for and method of aligning, calibrating, and maintaining a multichannel laser printhead in an LTT process for manufacturing OLED display devices, thereby minimizing errors in processing.

It is another object of the invention to measure the laser light beams that can affect the uniformity of printing in an LTT process for manufacturing OLED display devices so that a correction or channel-balancing algorithm might be applied (not included).

It is yet another object of the invention to provide a simple detection method of evaluating or verifying the operating condition of a multichannel laser printhead in an LTT process for manufacturing OLED display devices.

SUMMARY OF THE INVENTION

It is therefore an object of the present invention to more effectively use a multichannel laser printhead for transferring organic materials from a donor to a substrate in making an OLED device.

This object is achieved by a method of aligning in five degrees of freedom a multichannel laser printhead to be used in thermal transfer of material from a donor to a substrate, comprising:

a) providing a detection system forming a narrow aperture positioned in a plane parallel to the material transfer plane in the donor, a photodetector responsive to laser light passing through the narrow aperture to produce a signal, and further providing a controller adapted to produce a first and second series of laser irradiance profiles;

b) positioning the multichannel laser printhead in x and y directions parallel to the material transfer plane;

c) using a motion control system to sequentially position and scan in a direction perpendicular to the narrow aperture for at least one channel of the multichannel laser printhead and then for at least one other channel of the multichannel laser printhead relative to the aperture from an out-of-focus position through an above focus position so that the controller receives the signals from the photodetector and the motion control system to produce the first and second series of laser irradiance profiles;

d) using the first and second series of laser irradiance profiles to determine correction values needed for roll and yaw of the multichannel laser printhead and distance of the multichannel laser printhead from the material transfer plane;

e) aligning the multichannel laser printhead in accordance with the correction values whereby the multichannel laser printhead is aligned without performing a thermal transfer operation; and f) establishing the x and y coordinates of each channel of the multichannel laser printhead with respect to x and y coordinates of the motion control system.

DETAILED DESCRIPTION OF THE INVENTION

The present invention is a system for and method of alignment, maintenance, and calibration of a multichannel laser printhead in a laser thermal (LT) printing system. The multichannel laser printhead would be one that can selectively produce laser beam outputs from different positions. An example of such a printhead would be one with a single linear laser bar source illuminating a spatial modulator, an example of which is set forth in U.S. Pat. No. 6,582,875.

The multichannel laser printer system of the present invention includes a motion control system upon which is mounted a LT station and a detection system. The detection system is located in the same plane, or with a small measured offset in Z, as a donor in a Z position correlating to best focus, thereby providing a reliable reference for use when the multichannel laser printhead of the LT printer system is replaced or calibrated, or when the health of the multichannel laser printhead is being verified. The best focus plane of the multichannel laser printhead is the plane whereby the irradiance (power/area) of the multichannel linear laser light beams are maximum. Any other plane, at a different Z value, is considered out of focus.

Figure 1A:
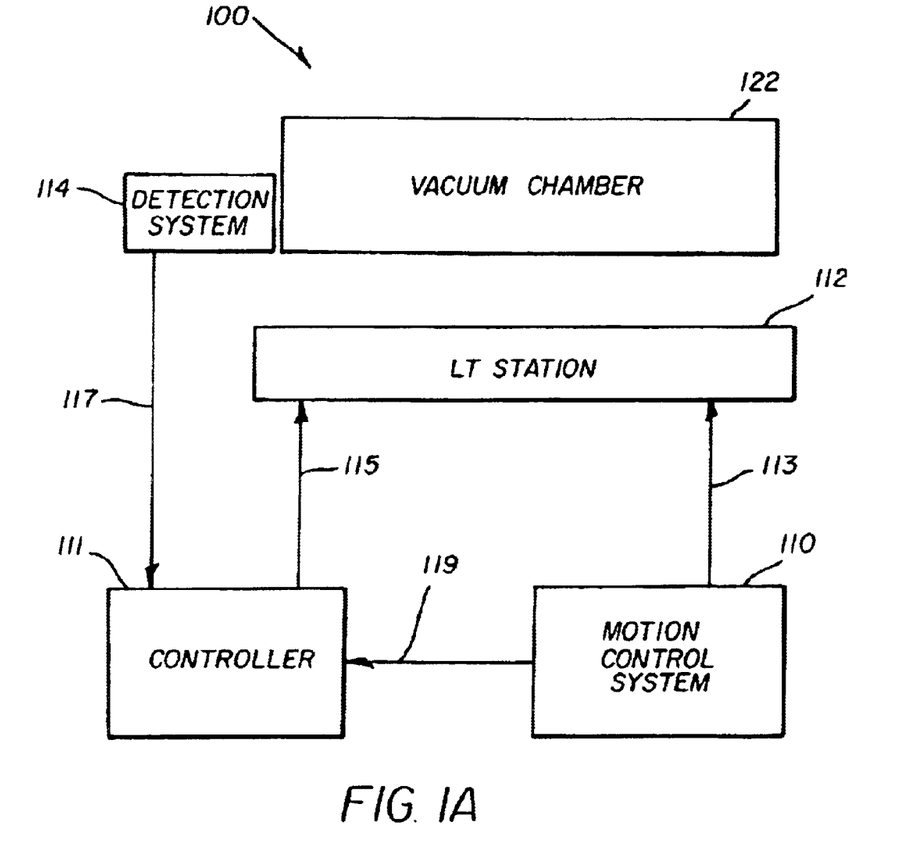
FIG. 1A illustrates a high-level block diagram of a laser thermal (LT) printer system.

FIG. 1A illustrates a high-level block diagram of laser thermal (LT) printer system 100 for use in an OLED fabrication process. LT printer system 100 includes a vacuum chamber 122, a controller 111, a motion control system 110 upon which is mounted a laser thermal (LT) station 112, and a detection system 114. Laser light beams can be directed to either the vacuum chamber 122 or the detection system 114 depending upon the positional commands 113 sent to the motion control system 110, and further depending upon the printhead control commands 115 sent by the controller 111 to the LT station 112. In response to the receipt of laser light beams directed to the correct portion of detection system 114, and upon commands from the controller 111, the detection system 114 will return irradiance data 117 to the controller 111. During the gathering of irradiance data 117, the controller 111 also gathers positional data 119 from the motion control system 110.

Figure 1B:
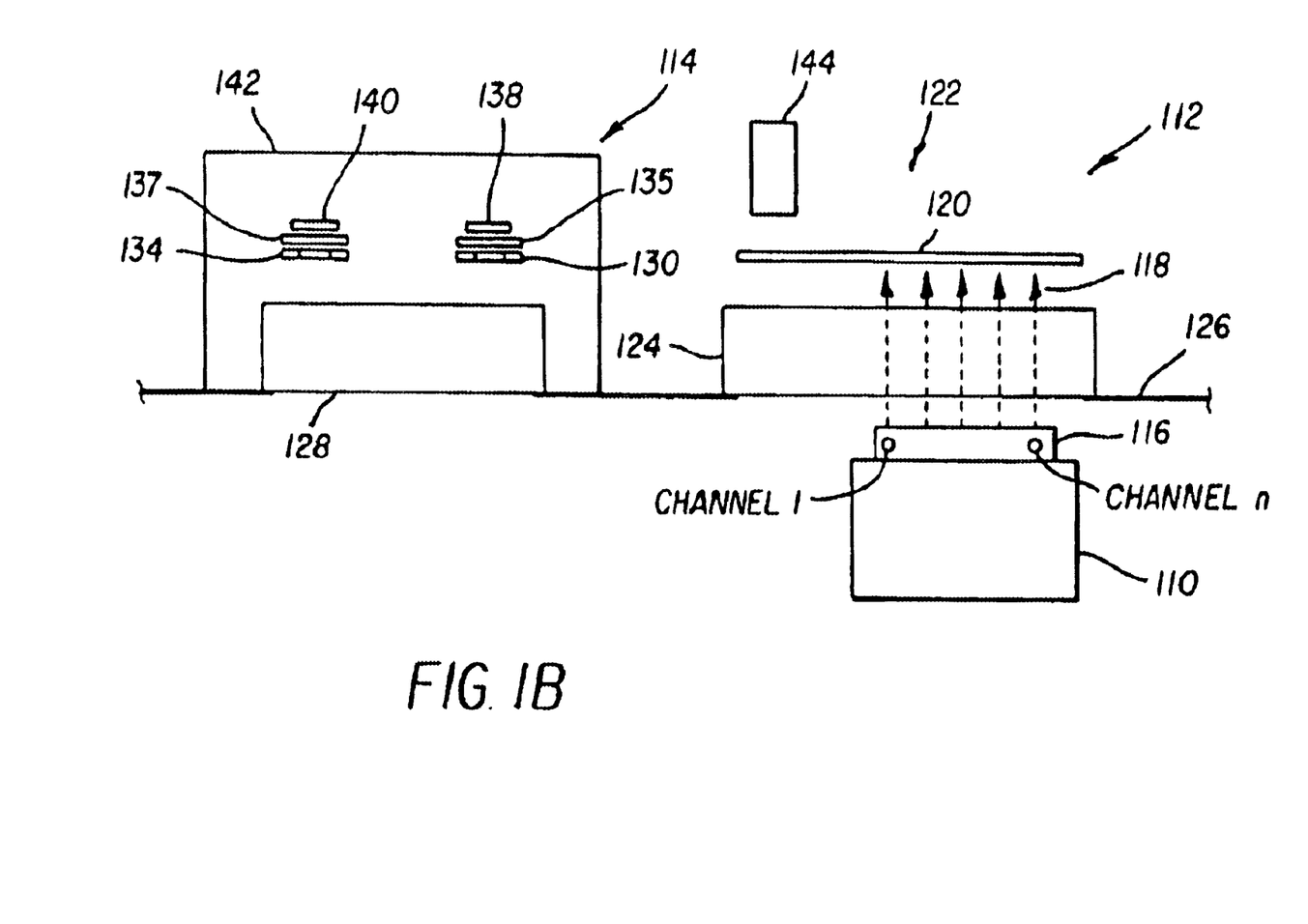
FIGS. 1B and 1C illustrate a side view and top view, respectively, of the laser thermal (LT) printer system of FIG. 1 for use in an OLED fabrication process.
Figure 1C:
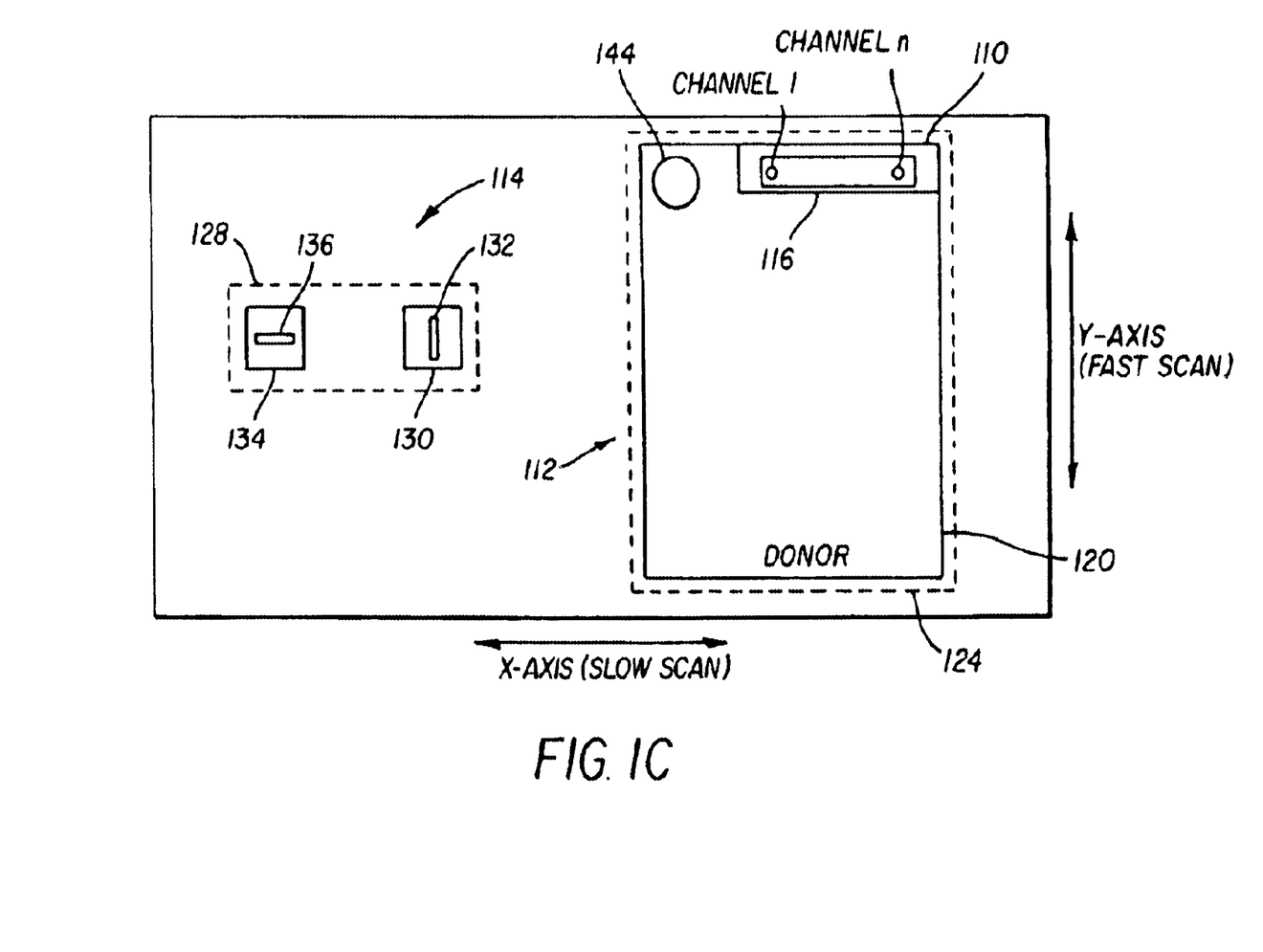

FIGS. 1B and 1C illustrate a more detailed side view and top view, respectively, of portions of laser thermal (LT) printer system 100 including the motion control system 110 upon which is mounted an LT station 112 and a detection system 114.

LT station 112 further includes a multichannel laser printhead 116 that typically uses a semiconductor laser bar source with illumination optics, a spatial light modulator, and post modulator optics to provide linear laser light beam channels 1 through n, where n is, for example, 256. Multichannel laser printhead 116 allows for individual on/off control of each channel. Multichannel laser printhead 116 is, for example, similar to the multichannel laser printhead of U.S. Pat. No. 6,169,565 B1 or EP 1 252 024. LT station 112 further includes motion control system 110 is a conventional precision motion control system that provides multichannel laser printhead 116 with precision X, Y, Z, and theta-Z ($\Theta z$) (rotation about the Z-axis or yaw), and theta-Y ($\Theta_Y$)(rotation about the Y axis or roll), motion relative to a donor 120 mounted within a conventional vacuum chamber 122. The conventions for motion in each axis for the embodiment are as follows: the X-axis is stepped during a slow scan; the Y-axis is quickly scanned; and the Z-axis is used to focus the laser light beams. During the installation of multichannel laser printhead 116, there is another multichannel laser printhead angular adjustment theta-Y ($\Theta_Y$) (rotation about the Y-axis or roll according the convention used here) to orient all the laser light beams to focus in the plane of donor 120. Donor 120 consists of a support layer that is predominantly transparent to the printhead laser wavelength and an energy absorbing layer, atop which is deposited an organic transfer layer typically formed of electroluminescent organic material. Lastly, LT station 112 includes a window 124 mounted within a chamber wall 126 of vacuum chamber 122.

Similarly, detection system 114 includes a window 128, an X-slit aperture 130 having a slit 132, a Y-slit aperture 134 having a slit 136, an X-attenuator 135, a Y-attenuator 137, an X-photodetector 138, and a Y-photodetector 140, all of which are enclosed by an enclosure 142 that is mechanically attached to chamber wall 126 of vacuum chamber 122. Window 128 is mounted within chamber wall 126 of vacuum chamber 122. Window 128 is aligned with X-slit aperture 130 and Y-slit aperture 134. X-slit aperture 130 is aligned with X-photodetector 138 and Y-slit aperture 134 is aligned with Y-photodetector 140. The spacing between X-slit aperture 130 and X-photodetector 138 and the spacing between Y-slit aperture 134 and Y-photodetector 140 is fixed at an optically advantageous predetermined distance. Enclosure 142 serves to isolate detection system 114 from the vacuum environment of vacuum chamber 122. It is alternatively possible to eliminate the use of window 128 for low numerical aperture (e.g., 0.06 NA) laser light beams, when no significant optical aberration is introduced by removal of the window.

A narrow aperture of uniform gap, sometimes referred to as a slit aperture, is shown as X-slit aperture 130 in FIG. 1C, and another is shown as Y-slit aperture 134. These are custom aperture devices that have narrow openings (i.e., slit 132 and slit 136, respectively) through which light passes. Slit 132 and slit 136 are oriented orthogonal to one another, as shown in FIG. 1C. X-photodetector 138 and Y-photodetector 140 are conventional optical sensors, such as United Detector Technology PIN 6DI, for detecting the laser light wavelength band.

Window 124 is aligned with donor 120 such that the laser outputs of multichannel laser printhead 116 may enter vacuum chamber 122 via window 124 to impinge upon donor 120 during operation, with minimal distortion. Similarly, window 128 is aligned with X-slit aperture 130 and Y-slit aperture 134 such that the laser outputs of multichannel laser printhead 116 may enter enclosure 142 via window 128 to impinge upon X-photodetector 138 and Y-photodetector 140 during operation, with minimal distortion. Motion control system 110 allows for the X-Y motion of multichannel laser printhead 116 over the full range of the areas of windows 124 and 128.

CCD camera 144 is a charge coupled device camera and is a well known position measurement device by those skilled in the art, for example, a CCD camera imaging system from Spiricon Inc. CCD camera 144 is used to establish the X-Y coordinates of each channel of multichannel laser printhead 116 with respect to the X and Y coordinates of motion control system 110.

The operation of LT station 112 is as follows: multichannel laser printhead 116 generates one or more selected laser light beams 118 based upon a predefined pattern. Laser light beams 118 then pass through window 124 of vacuum chamber 122 and impinge upon donor 120 in this predefined pattern. The majority of the laser energy is absorbed by a light-absorbing layer within donor 120 and is converted to heat. The conversion of the laser's energy to heat sublimates the organic material that forms the top layer of donor 120, thereby vaporizing the organic material and forming an evaporant that is deposited in the desired subpixel pattern upon a substrate (not shown) for forming an OLED display device. The planar region defined by the light-absorbing layer within donor 120 and the top layer of the donor 120 is referred to as the material transfer plane.

X-slit aperture 130 and Y-slit aperture 134 of detection system 114 are set in the same plane as donor 120, or parallel to the donor plane with an offset in Z, so that they are a reliable reference for use when multichannel laser printhead 116 is replaced or simply when the health of multichannel laser printhead 116 is being checked. The setup and operation of detection system 114 is described in reference to FIGS. 2 through 8.

Figure 2:
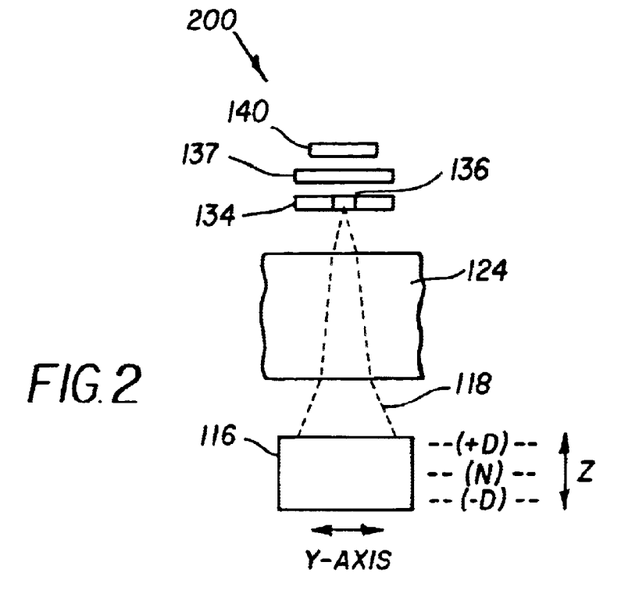
FIG. 2 illustrates an exploded view of a first portion of a detection system of the multichannel laser printer system in accordance with the invention.

FIG. 2 illustrates an exploded view 200 that is representative of a first portion of detection system 114. More specifically, exploded view 200 demonstrates the operation of multichannel laser printhead 116 in conjunction with Y-slit aperture 134, set at a fixed distance from Y-photodetector 140. FIG. 2 illustrates three positions for multichannel laser printhead 116. The lowest Z height position, the position at which the multichannel laser printhead 116 is removed and replaced, is designated as the −D position. The Z height of replacement multichannel laser printhead 116 that produces peak laser irradiance is designated as the N position. The highest position of Z height of replacement multichannel laser printhead 116 is designated as the +D position. Additionally, FIG. 2 illustrates laser light beams 118 emitting from multichannel laser printhead 116, passing through window 124, and subsequently passing through slit 136 of Y-slit aperture 134, where a portion of the light subsequently impinges upon Y-photodetector 140. Furthermore, Y-attenuator 137 for attenuating the light is located between Y-slit aperture 134 and Y-photodetector 140. Y-attenuator 137 is a well known device that reduces the power of the optical signal by inducing loss.

Figure 3:
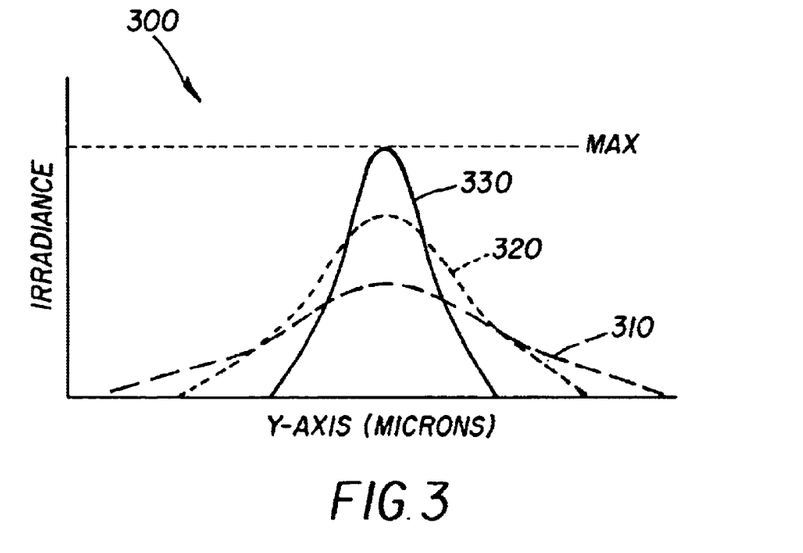
FIG. 3 illustrates a series of plots that are representative of a typical laser irradiance profiles vs. Y position of the multichannel laser printhead as measured by a Y-photodetector in accordance with the invention.

The width of slit 136 is set to, for example, the equivalent of the full-width-half-maximum ($FWHM_y$) of laser light beams 118, for example, 9 microns. As multichannel laser printhead 116 is scanned along the Y-axis, laser light beams 118 impinge upon Y-photodetector 140. A laser irradiance profile, such as that shown in FIG. 3, is measured via Y-photodetector 140 multichannel laser. This laser irradiance profile relates the irradiance data 117 to the positional data 119, which indicates the location in Y of the printhead as gathered during the scanning process from the motion control system 110. The laser irradiance profile varies depending upon the Z height of multichannel laser printhead 116 relative to Y-slit aperture 134, in a fashion consistent with being out of focus in either the −D or +D position, or in focus at the N position.

FIG. 3 illustrates a plot 300 that is representative of three typical laser irradiance profiles as measured by Y-photodetector 140. The laser irradiance profile varies depending upon the Z height of multichannel laser printhead 116 relative to Y-slit aperture 134. For example, a curve 310, a curve 320, and a curve 330 are sample laser irradiance profiles associated with various Z height settings of multichannel laser printhead 116 relative to Y-slit aperture 134. Curve 330 is representative of the best focus Z height setting of multichannel laser printhead 116 relative to Y-slit aperture 134, in which a maximum value of irradiance is achieved. Further details of how these irradiance profiles are used within LT printer system 100 are described with reference to FIGS. 6, 7, and 8.

Figure 4:
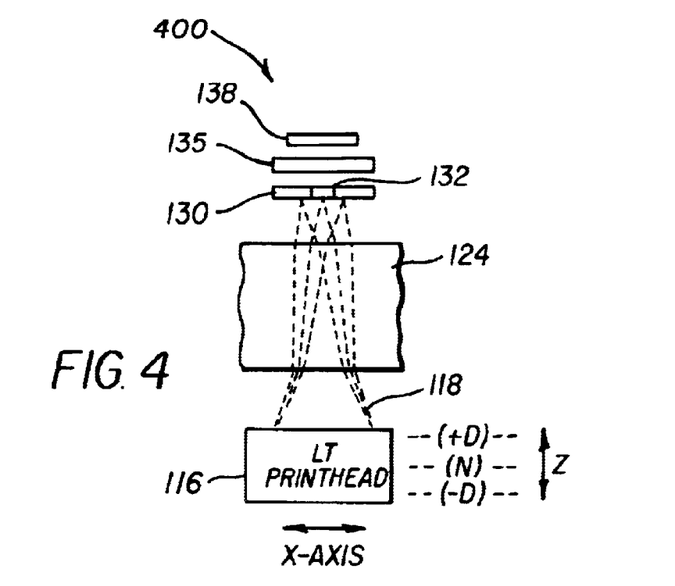
FIG. 4 illustrates an exploded view of a second portion of the detection system of the multichannel laser printer system in accordance with the invention.
Figure 5:
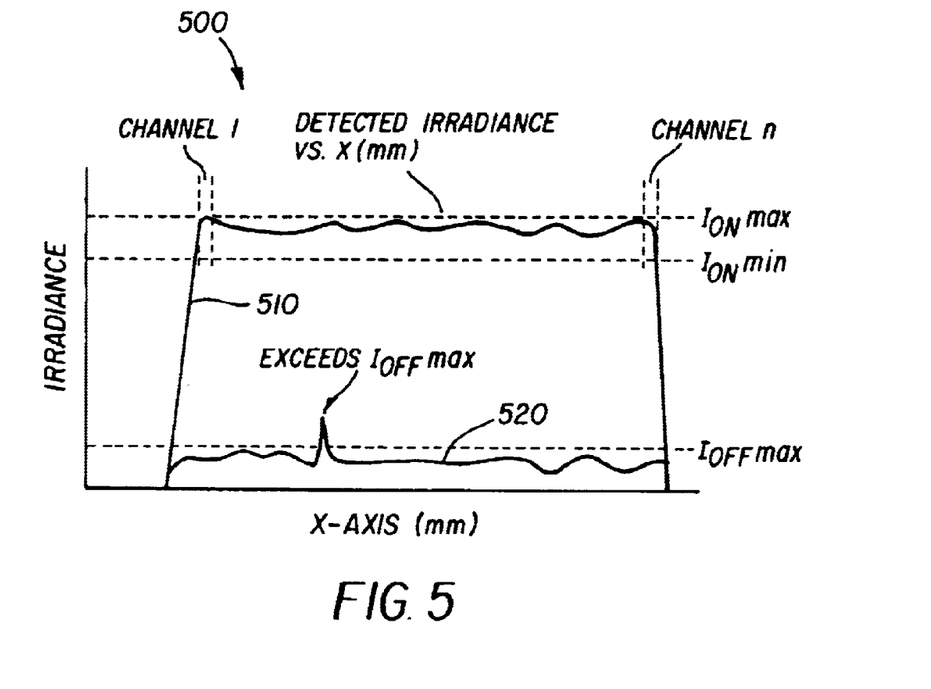
FIG. 5 illustrates two plots that are representative of typical laser irradiance profiles of all channels of an multichannel laser printhead as a function of the irradiance detected by an X-photodetector vs. the X position of the multichannel laser printhead.

FIG. 4 illustrates an exploded view 400 that is representative of a second portion of detection system 114. More specifically, exploded view 400 demonstrates the operation of multichannel laser printhead 116 in conjunction with X-slit aperture 130 that is set at a fixed distance from X-photodetector 138. FIG. 4 illustrates laser light beams 118 emitting from multichannel laser printhead 116, passing through window 124, and subsequently arriving at the plane of slit 132 of X-slit aperture 130, where a portion of the light subsequently impinges upon X-photodetector 138. Furthermore, X-attenuator 135 for attenuating the light is located between X-slit aperture 130 and X-photodetector 138. X-attenuator 135 is a well known device that reduces the power of the optical signal by inducing loss. The width of slit 132 is set to, for example, the equivalent of the FWHM of a single laser light beam channel in the X dimension, for example, 20 microns. As multichannel laser printhead 116 is scanned along the X-axis, all laser light beams 118 associated with channels 1 to n sequentially impinge upon X-photodetector 138. An irradiance profile for laser light beams 118, such as those profiles shown in FIG. 5, is measured via X-photodetector 138 multichannel laser. This laser irradiance profile relates the irradiance data 117 to the positional data 119 in X of the printhead as gathered during the scanning process from the motion control system 110. The laser light beam irradiance profile may vary due to nonuniformities in the laser light source and the optical elements in multichannel laser printhead 116. X-slit aperture 130 should be at the best focus, as defined for Y-slit aperture 134 in the previous paragraph. The assembly of X-slit aperture 130 with X-photodetector 138 is mechanically coupled in the same plane as the assembly of Y-slit aperture 134 with Y-photodetector 140, so that both are in the best focus plane.

FIG. 5 illustrates a plot 500 that is representative of a measurement of two typical laser light beam channel irradiance profiles of all channels of multichannel laser printhead 116 as a function of radiance detected by X-photodetector 138 vs. the X position of multichannel laser printhead 116. An ON curve 510 is a plot representative of all channels 1 to n turned on as multichannel laser printhead 116 is scanned along the X-axis and a maximum value of irradiance is achieved, assuming a best focus Z height setting of multichannel laser printhead 116 relative to X-slit aperture 130. An OFF curve 520 is a plot representative of all channels 1 to n turned off as multichannel laser printhead 116 is scanned along the X-axis and a minimum value of irradiance data 117 is achieved, assuming a best focus Z height setting of multichannel laser printhead 116 relative to X-slit aperture 130. Further details of how the measurements represented by ON curve 510 and OFF curve 520 are used within LT printer system 100 are described in reference to FIGS. 6 and 8.

Figure 6:
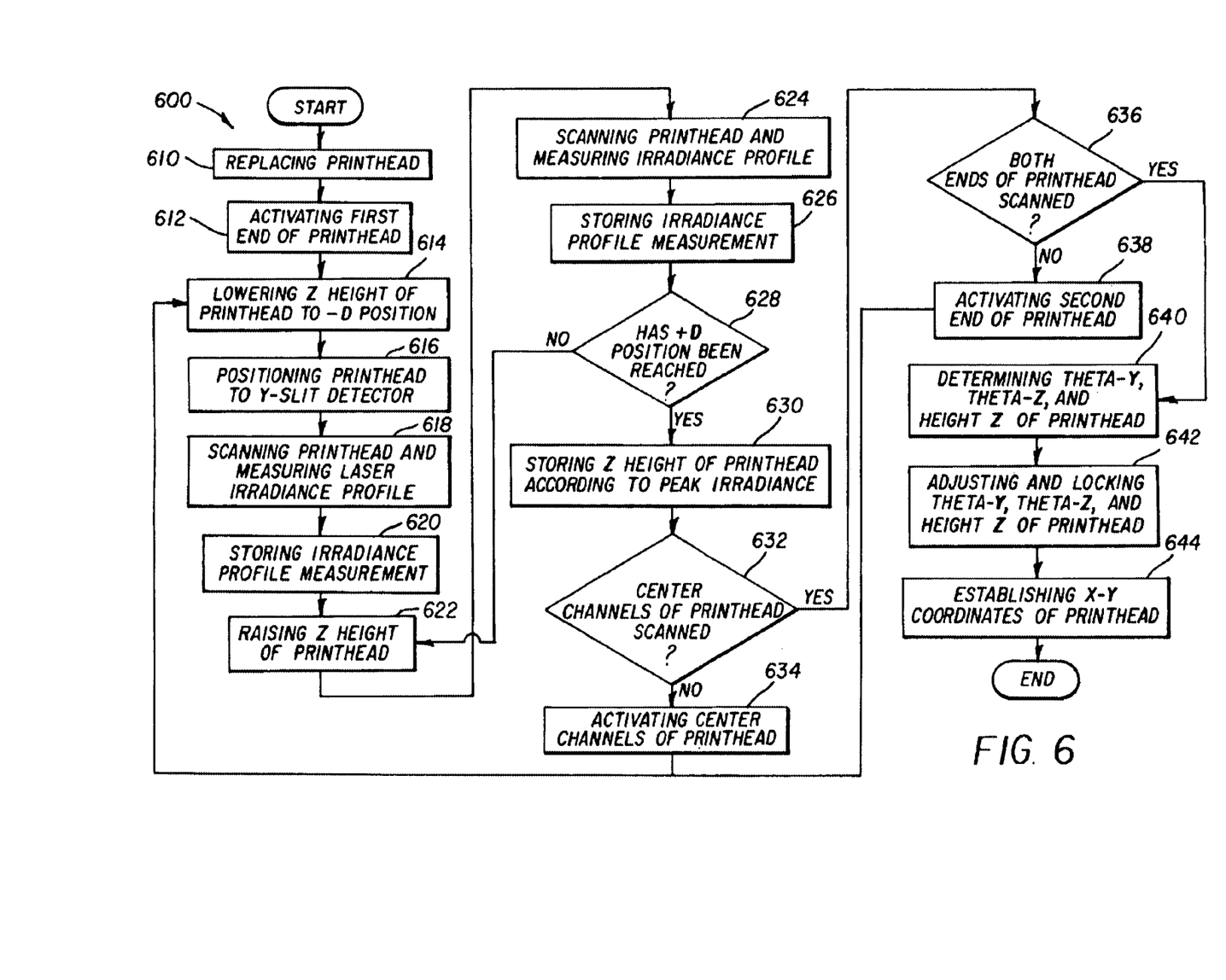
FIG. 6 shows a flow diagram of a method of replacing a printhead within an LTT process for OLED fabrication in accordance with the invention.

FIG. 6 shows a flow diagram of a method 600 of replacing multichannel laser printhead 116 within an LTT process for OLED fabrication in accordance with the invention. LT printer system 100 as described in FIGS. 1–5 is referenced throughout the steps of method 600. Method 600 includes the following steps:

Step 610: Installing Printhead

In this step, multichannel laser printhead 116 is removed and a replacement multichannel laser printhead 116 is installed. Method 600 proceeds to step 612.

Step 612: Activating First End of Printhead

In this step, at least one channel of the multichannel laser printhead located at the first end of replacement multichannel laser printhead 116 are activated. Method 600 proceeds to step 614.

Step 614: Lowering Z Height of Replacement Printhead to −D Position

In this step, the Z height of replacement multichannel laser printhead 116 is lowered to a −D position, also known as an out-of-focus position, using a micrometer Z position translator, where −D is, for example, −250 microns from N, where N has been determined previously by an additional process Method 600 proceeds to step 616.

Step 616: Positioning Multichannel Laser Printhead to Y-slit Detector

In this step, replacement multichannel laser printhead 116 is translated along the X-axis and Y-axis of LT printer system 100 using motion control system 110 such that the active channel(s) of replacement multichannel laser printhead 116 are located in alignment with Y-slit aperture 134. Motion control system 110 records the X- and Y-coordinates of this position. Method 600 proceeds to step 618.

Step 618: Scanning Multichannel Laser Printhead and Measuring Laser Irradiance Profile In this step, at least one channel of the replacement multichannel laser printhead 116 are scanned across Y-slit aperture 134 along the Y-axis using motion control system 110. The resulting laser light beams 118 pass through slit 136 of Y-slit aperture 134 and impinge upon Y-photodetector 140. Method 600 proceeds to step 620.

Step 620: Storing Irradiance Profile Measurement

In this step, Y-photodetector 140 detects the irradiance of laser light beams 118 and generates an output signal accordingly that is received and recorded by the controller 111 of LT printer system 100. In addition, the motion control system 110 generates an output signal indicating the Y location of the printhead during scanning that is received and recorded by the controller 111 of the LT printer system 100. Method 600 proceeds to step 622.

Step 622: Raising Z Height of Printhead

In this step, the Z height of replacement multichannel laser printhead 116 is raised by a predetermined increment ΔD using a micrometer Z position translator. ΔD is, for example, +25 microns. Method 600 proceeds to step 624.

Step 624: Scanning Multichannel Laser Printhead and Measuring Irradiance Profile In this step, at least one channel of replacement multichannel laser printhead 116 are scanned across Y-slit aperture 134 along the Y-axis using motion control system 110. The resulting laser light beams 118 pass through slit 136 of Y-slit aperture 134 and impinge upon Y-photodetector 140. Method 600 proceeds to step 626.

Step 626: Storing Irradiance Profile Measurement

In this step, Y-photodetector 140 detects the irradiance of laser light beams 118 and generates an output signal accordingly that is received and recorded by the controller 111 of LT printer system 100. In addition, the motion control system 110 generates an output signal indicating the Y location of the printhead during scanning that is received and recorded by the controller 111 of the LT printer system 100. Method 600 proceeds to step 628.

Step 628: Has +D Position Been Reached?

In this decision step, it is determined whether the Z height of replacement multichannel laser printhead 116 is set at the +D position, also known as an above focus position. If yes, method 600 proceeds to step 630. If no, method 600 returns to step 622.

Step 630: Storing Z Height of Multichannel Laser Printhead According to Peak Irradiance In this step, the Z height of replacement multichannel laser printhead 116 that produces peak laser irradiance is determined and stored for one or more active channels of replacement multichannel laser printhead 116, such as curve 330 of plot 300 of FIG. 3, as measured by the controller 111 of LT printer system 100. Method 600 proceeds to step 632.

Step 632: Center Channels of Multichannel Laser Printhead Scanned?

In this decision step, it is determined whether one or more active channels in the middle of replacement multichannel laser printhead 116 have been scanned across Y-slit aperture 134 along the Y-axis using motion control system 110. If yes, method 600 proceeds to step 636. If no, method 600 proceeds to step 634.

Step 634: Activating Center Channels of Printhead

In this step, all channels of replacement multichannel laser printhead 116 are deactivated. Subsequently, one or more channels located in the middle of replacement multichannel laser printhead 116 are activated. Method 600 returns to step 614.

Step 636: Both Ends of Multichannel Laser Printhead Scanned?

In this decision step, it is determined whether both ends of replacement multichannel laser printhead 116 have been scanned across Y-slit aperture 134 along the Y-axis using motion control system 110. If yes, method 600 proceeds to step 640. If no, method 600 proceeds to step 638.

Step 638: Activating Second End of Printhead

In this step, all channels of replacement multichannel laser printhead 116 are deactivated. Subsequently, one or more end channels located at the second end of replacement multichannel laser printhead 116 are activated. Method 600 returns to step 614.

Step 640: Determining Theta-Y, Theta-Z, and Height Z of Multichannel Laser Printhead In this step, Theta-Y ($\Theta_Y$), Theta-Z ($\Theta_Z$), and height Z are calculated for multichannel laser printhead 116 using the Z height data determined in step 630, and irradiance data measured in steps 618 and 624 from both end channel or channels of the printhead, and center channels if desired. Theta-Y ($\Theta_Y$), Theta-Z ($\Theta_Z$), and height Z of multichannel laser printhead 116 are determined to achieve best focus position N from channel 1 to channel n. The corresponding correction values or amplitudes of adjustment to the Theta-Y ($\Theta_Y$), Theta-Z ($\Theta_Z$), and height Z of multichannel laser printhead 116 are also determined. Method 600 proceeds to step 642.

Step 642: Adjusting and Locking Theta-Y, Theta-Z, and Height Z of Multichannel Laser Printhead In this step, multichannel laser printhead 116 is adjusted in three degrees of freedom based upon the correction values, if required, using Theta-Y ($\Theta_Y$), Theta-Z ($\Theta_Z$), and height Z calculated in step 640 to achieve best focus position N from channel 1 to channel n at the material transfer plane, that can be offset in Z from the slit detector plane, and also that laser light beams 118 are orthogonal to the Y-axis. The adjustments of the printhead orientation, (Theta-Y ($\Theta_Y$), Theta-Z ($\Theta_Z$)), and Z height can be made manually or automatically using additional axes of control in the previously described motion control system 110. The orientation and Z height of replacement multichannel laser printhead 116 are locked into place. Method 600 proceeds to step 644.

Step 644: Establishing X-Y Coordinates of Printhead

In this step, the first and last ($n^{th}$) channel, for example, of replacement multichannel laser printhead 116 are imaged with CCD camera 144 to establish the X-Y coordinates of each channel centroid with respect to the X and Y coordinates of motion control system 110. This step provides the alignment in the final two degrees of freedom, X and Y, of the printhead relative to the motion control system 110. Method 600 ends. Reviewing, the above method aligns a multichannel laser printhead in five degrees of freedom.

In an alternate embodiment of method 600, a CCD camera with appropriate attenuator and image-processing software that determines peak light level could be used in lieu of Y-slit aperture 134 and Y-photodetector 140 to determine the laser light beam channel peak irradiance for Z height in steps 616 through 626. The laser light beam channel X, Y centroid location is a determined with appropriate CCD image-processing software using for example, a CCD camera imaging system from Spiricon Inc. Good uniform CCD pixel response and camera calibration are important to the successful implementation of this alternative measurement method.

In summary, method 600 is a method of replacing multichannel laser printhead 116 within an LTT process for OLED fabrication in accordance with the invention. This is accomplished by locating Y-slit aperture 134 and X-slit aperture 130 in the Z dimension in relation to donor 120, thereby allowing Y-slit aperture 134 and X-slit aperture 130 to be used as a reference for setting up the best focus position of multichannel laser printhead 116 without the need for performing an actual printing operation. The assembly of X-slit aperture 130 and X-photodetector 138 and the assembly of Y-slit aperture 134 and Y-photodetector 140 provide a reliable reference for use when multichannel laser printhead 116 is replaced or calibrated, or when the health of multichannel laser printhead 116 is verified. The method outlined in method 600 allows for the aligning of the printhead in three degrees of freedom based upon the use of at least three sets of laser irradiance profiles from three different groups of at least one channel of the multichannel laser printhead. The final two degrees of freedom, X and Y are then established with respect to the X and Y coordinates of the motion control system.

Figure 7:
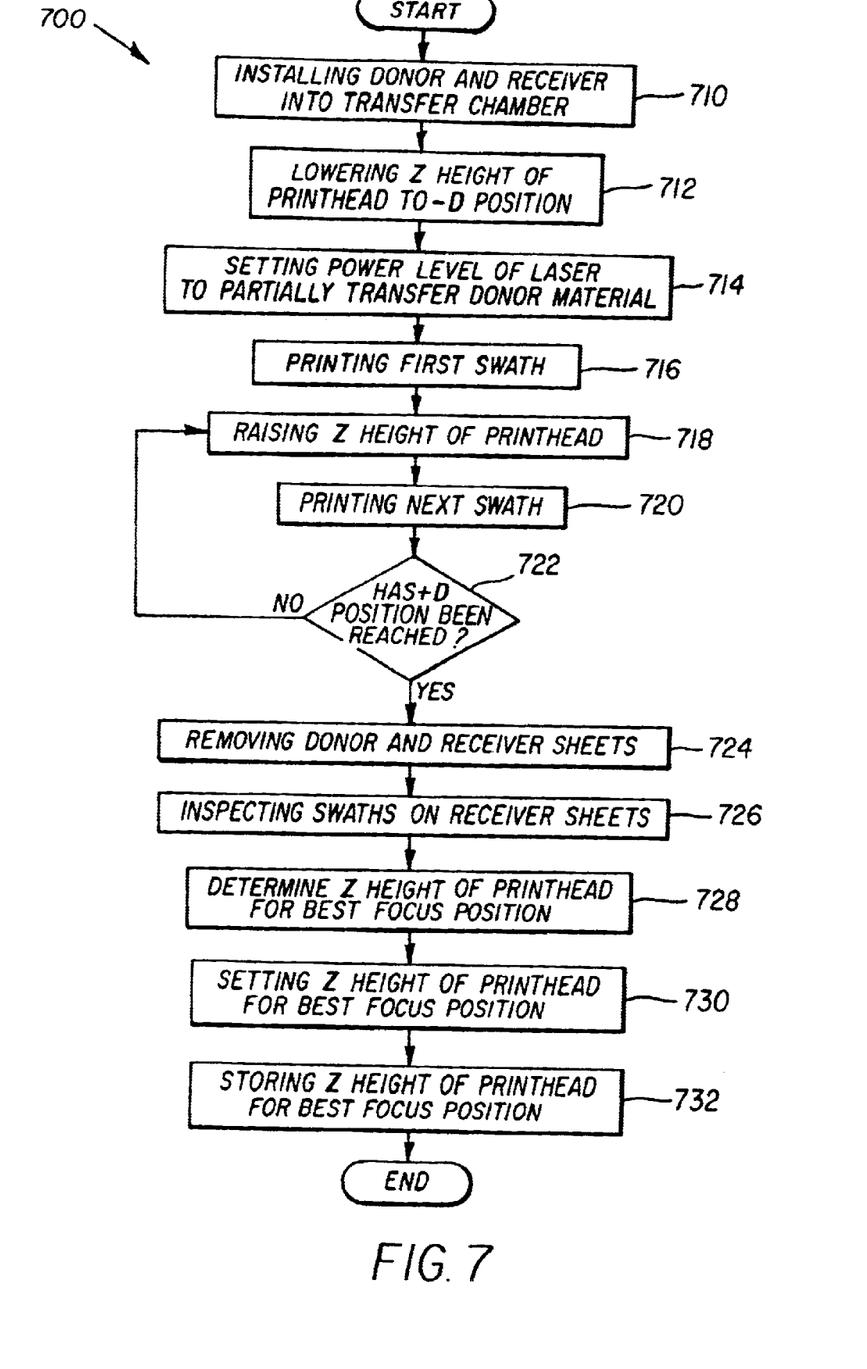
FIG. 7 shows a flow diagram of a method of initially setting up a printhead within an LTT process for OLED fabrication in accordance with the invention.

FIG. 7 shows a flow diagram of a method 700 of initial setup of a printhead with the LT printer system within an LTT process for OLED fabrication in accordance with the invention. LT printer system 100 as described in FIGS. 1–5 is referenced throughout the steps of method 700. The method 700 determines the offset distance between the material transfer plane and the narrow aperture plane and adjusting the position of the multichannel laser printhead in accordance with the offset distance. Method 700 includes the following steps:

Step 710: Installing Donor and Receiver into Transfer Chamber

In this step, a donor 120, and an associated receiver (substrate) are installed within vacuum chamber 122 of LT station 112 of LT printer system 100. Method 700 proceeds to step 712.

Step 712: Lowering Z Height of Multichannel Laser Printhead to –D Position

In this step, from an estimated nominal best focus position N (see FIG. 2), the Z height of multichannel laser printhead 116 is lowered to a –D position that is, for example, –250 microns from N using a micrometer Z position translator, where N is determined analytically. Method 700 proceeds to step 714.

Step 714: Setting Power Level of Laser to Partially Transfer Organic Material from a Donor In this step, the power level of the laser feeding multichannel laser printhead 116 is set such that, if multichannel laser printhead 116 is set at a best focus Z height, some, but not all, of the material from the donor 120 is transferred. This operation ensures that, when multichannel laser printhead 116 is at a Z height setting that is not at best focus, little or no material will be transferred to the substrate. Method 700 proceeds to step 716.

Step 716: Printing First Swath

In this step, with the Z height position of multichannel laser printhead 116 set to –D, a first swath of printing occurs as multichannel laser printhead 116 translates in the fast scan direction (Y-axis) via motion control system 110 with all channels of the multichannel laser printhead 116 activated such that laser light beams 118 impinge upon donor 120. The value of the Z height of multichannel laser printhead 116 associated with this swath is stored within the system controller 111 of LT printer system 100. Method 700 proceeds to step 718.

Step 718: Raising Z Height of Multichannel Laser Printhead

In this step, the Z height of multichannel laser printhead 116 is raised by a predetermined increment $\Delta D$ using a micrometer Z position translator. $\Delta D$ is, for example, +25 microns. Method 700 proceeds to step 720.

Step 720: Printing Next Swath

In this step, multichannel laser printhead 116 is translated one step in the slow scan direction (X-axis) via motion control system 110. A next swath of printing occurs adjacent to any previously printed swath via multichannel laser printhead 116 translating in the fast scan direction (Y-axis) via motion control system 110 with all channels of the multichannel laser printhead 116 activated such that laser light beams 118 impinge upon donor 120. The value of the Z height of multichannel laser printhead 116 associated with this swath is stored within the system controller 111 of LT printer system 100. Method 700 proceeds to step 722.

Step 722: Has +D Position been Reached?

In this decision step, it is determined whether the Z height of multichannel laser printhead 116 is set at the +D position. If no, method 700 returns to step 718. If yes, method 700 proceeds to step 724.

Step 724: Removing Donor and Receiver Sheets

In this step, donor 120 and the associated receiver (substrate) are removed from within vacuum chamber 122 of LT station 112 of LT printer system 100 and are transferred to an optical inspection station. Method 700 proceeds to step 726.

Step 726: Inspecting Swaths on Receiver Sheet

In this step, the receiver (substrate) is visually inspected and the swath is located with the largest amount of material from the donor. Method 700 proceeds to step 728.

Step 728: Determining Z Height of Multichannel Laser Printhead for Best Focus Position In this step, the Z height of multichannel laser printhead 116 for the best focus position is determined to be at the Z height that corresponds with the swath located in step 726 (as retrieved from the controller 111 of LT printer system 100) having the largest amount of transferred material. The corresponding correction values or amplitudes of adjustment to the height Z of multichannel laser printhead 116 are also determined. Method 700 proceeds to step 730.

Step 730: Setting Z Height of Multichannel Laser Printhead to Best Focus Position In this step, the Z height of multichannel laser printhead 116 is set at the Z height, based upon the correction values that corresponds with the position determined in step 728 that resulted in the largest amount of transferred material. Method 700 proceeds to step 732.

Step 732: Storing Z Height of Multichannel Laser Printhead for Best Focus Position In this step, the Z height of multichannel laser printhead 116 that corresponds with the position determined in step 728 and the offset distance, or difference in height between the material transfer plane of donor 120 and the narrow aperture plane, or Y-slit aperture 134 are stored in the controller 111 of LT printer system 100. Method 700 ends.

In summary, method 700 is a method of determining the best focus setting of multichannel laser printhead 116 in relation to the material transfer plane of donor 120 for initial setup of a multichannel laser printhead within an LTT process for OLED fabrication in accordance with the invention. Method 700 is also used should a change in position ever occur between the material transfer plane of donor 120 and either Y-slit aperture 134 or X-slit aperture 130.

Figure 8:
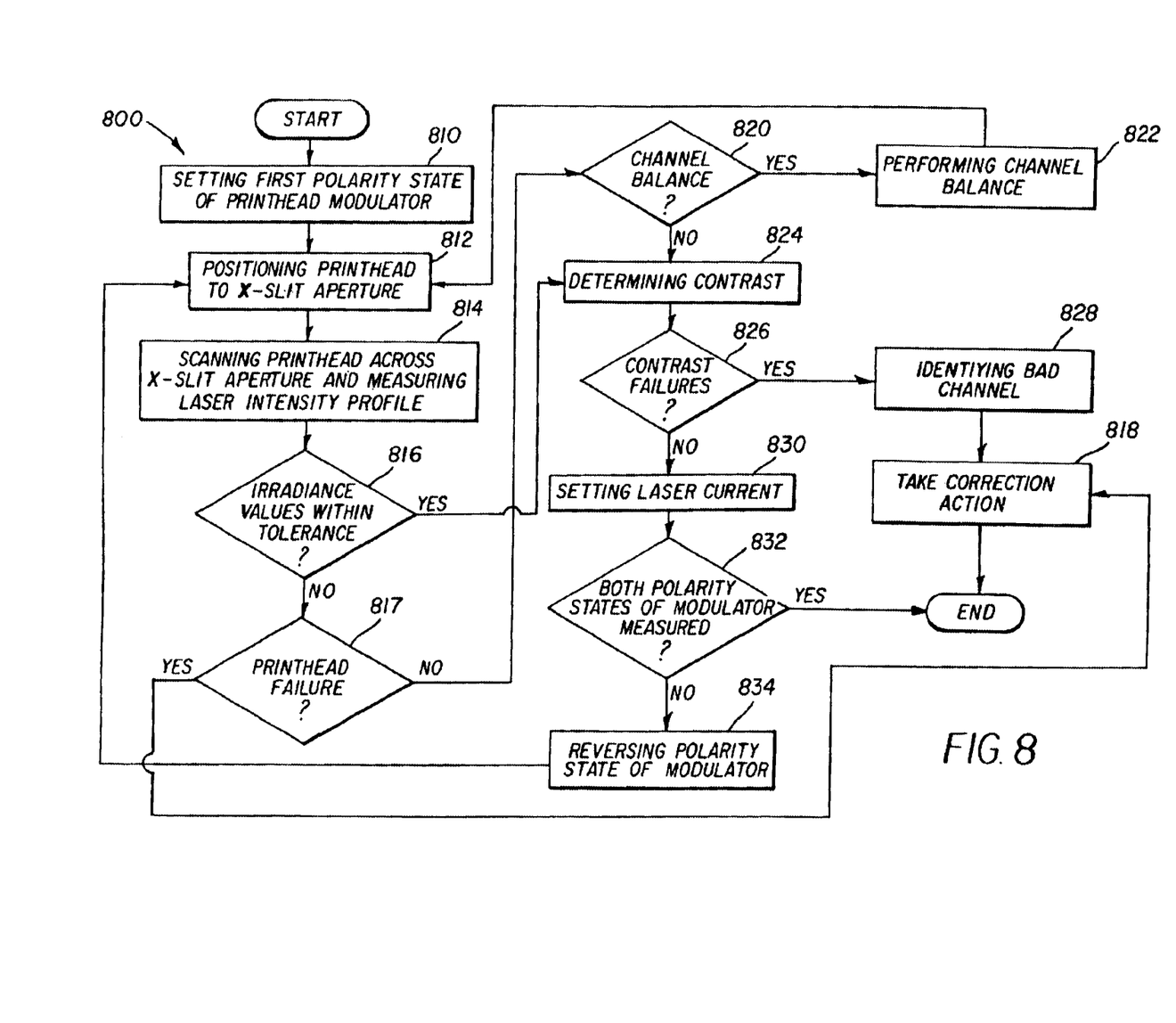
FIG. 8 shows a flow diagram of a method of measuring channel irradiance profiles and total power of a printhead within an LTT process for OLED fabrication in accordance with the invention.

FIG. 8 shows a flow diagram of a method 800 of measuring the irradiance profiles of laser light beams and measuring the total power of a printhead within an LT process for OLED fabrication in accordance with the invention. It is assumed that methods 600 and 700 have been performed prior to the start of method 800 and the multichannel laser printhead is focused to the X-slit and Y-slit aperture plane. LT printer system 100, as described in FIGS. 1–5, is referenced throughout the steps of method 800. When all channels are activated on, they need to provide sufficient laser irradiance and uniformity to transfer most or all of the donor material to the receiver in the LT station 112, e.g. be sufficiently above a transfer threshold. When all channels are activated off, they need to be sufficiently low in irradiance, and high in contrast and uniformity, so as to transfer little or no donor material to the receiver in the LT station 112, e.g. be sufficiently below transfer threshold. Method 800 includes the following steps:

Step 810: Setting First Polarity State of Multichannel Laser Printhead Modulator In this step, the first of two polarity states, for example voltage polarity, of the laser printhead modulator is set. Method 800 proceeds to step 812.

Step 812: Positioning Multichannel Laser Printhead to X-slit Aperture

In this step, multichannel laser printhead 116 is translated along the X-axis and Y-axis of LT printer system 100 using motion control system 110 such that multichannel laser printhead 116 is located in alignment with X-slit aperture 130. Method 800 proceeds to step 814.

Step 814: Scanning Multichannel Laser Printhead Across X-slit Aperture and Measuring Laser Irradiance Profile In this step, all channels of multichannel laser printhead 116 are in an activated on condition and multichannel laser printhead 116 is scanned across X-slit aperture 130 along the X-axis using motion control system 110. The resulting laser light beams 118 sequentially pass through slit 132 of X-slit aperture 130 and impinge upon X-photodetector 138. X-photodetector 138 detects the irradiance of laser light beams 118 and accordingly generates an output signal that is received and recorded by the controller 111 of LT printer system 100. The output signal of X-photodetector 138 is gathered as a function of the X position of multichannel laser printhead 116, as received from the motion control system 110, and as shown, for example, by ON curve 510 in plot 500 of FIG. 5. Method 800 proceeds to step 816.

Step 816: Irradiance Values within Tolerance?

In this decision step, the irradiance values of laser light beams 118, which range from $I_{ON}$max to $I_{ON}$min as shown in FIG. 5, are verified to be within a predetermined limit, for example, $\leq 15\%$ of $I_{ON}$max. If the values are within tolerance, method 800 proceeds to step 824. If not, method 800 proceeds to step 817.

Step 817: Multichannel Laser Printhead Failure?

In this decision step, it is determined whether there is a gross failure of multichannel laser printhead 116 based upon the laser light beams irradiance values measured in step 814. If so, or if it is determined that multichannel laser printhead 116 requires a channel balancing operation numerous times (e.g., more than four times), method 800 proceeds to step 818. If not, method 800 proceeds to step 820.

Step 818: Take Corrective Action?

In this decision step, it is determined whether the multichannel laser printhead 116 should be closely monitored, replaced, or repaired.

Step 820: Channel Balance

In this decision step, it is determined whether multichannel laser printhead 116 requires a channel balance procedure based upon the laser irradiance values measured in step 814. If yes, method 800 proceeds to step 822; if no, method 800 proceeds to step 824.

Step 822: Performing Channel Balance

In this step, the irradiance level of each laser light beam channel (or each group of two or more laser light beams, as in EP 1 094 925) is adjusted to have similar irradiance values. Alternately, the pulse width of each light beam channel during writing is adjusted so that a similar energy is delivered to the material of donor 120, taking into account any reciprocity failure. Method 800 then returns to step 812.

Step 824: Determining Contrast

In this step, all channels of multichannel laser printhead 116 are deactivated ($I_{off}$), or in the activated off condition, and multichannel laser printhead 116 is scanned across X-slit aperture 130 along the X-axis using motion control system 110. The remaining laser light beam channel emission passes through slit 132 of X-slit aperture 130, and X-photodetector 138 detects any channel emission and accordingly generates an output signal that is received and recorded by the controller 111 of LT printer system 100. The output signal of X-photodetector 138 is gathered as a function of the X position of multichannel laser printhead 116, as received from the motion control system 110, and as shown, for example, by OFF curve 520 in plot 500 of FIG. 5. The ratio of $I_{ON}/I_{OFF}$ is calculated for each channel of multichannel laser printhead 116 and is recorded by the controller 111 of LT printer system 100. Method 800 proceeds to step 826.

Step 826: Contrast failures?

In this decision step, the calculated ratio of $I_{ON}/I_{OFF}$ for each channel of multichannel laser printhead 116 is compared to a predetermined acceptable value, such as $\geq 10$, to determine whether the contrast of any channel has failed. Any channel of multichannel laser printhead 116 whose calculated ratio of $I_{ON}/I_{OFF}$ exceeds this predetermined acceptable value is classified as a contrast failure. If a channel is found to have failed, method 800 proceeds to step 828. If no channel has failed, method 800 proceeds to step 830.

Step 828: Identifying Bad Channel

In this step, the failed channel is identified based upon the X position of multichannel laser printhead 116 that correlates with the failing $I_{ON}/I_{OFF}$ value. Method 800 proceeds to step 818.

Step 830: Setting Laser Current

In this step, the relationship between laser drive current and total printhead output power is determined using the sum of the $I_{ON}$ values of all channels of multichannel laser printhead 116 as measured in step 814 and the currently detected laser drive current from the controller 111. This sum is an indicator of total printhead output laser power when the curve is integrated. Method 800 proceeds to step 832.

Step 832: Both Polarity States of Modulator Measured?

In this decision step, it is determined whether the channel irradiance profiles have been measured for both polarity states of the modulator. If yes, method 800 ends; if no, method 800 proceeds to step 834.

Step 834: Reversing Polarity State of Modulator

In this step, the second of the two polarity states is set. Method 800 returns to 812.

In summary, LT printer system 100, which includes LT station 112 and detection system 114 mounted upon motion control system 110, provides a system for and method of aligning, calibrating, and maintaining (i.e., methods 600, 700, and 800, respectively) a multichannel laser printhead, such as multichannel laser printhead 116, in an LTT process for manufacturing OLED display devices, thereby minimizing errors in processing, achieving uniform printing, and providing a simple detection method of evaluating or verifying the health of a multichannel laser printhead in an LTT process for manufacturing OLED display devices.

The invention has been described in detail with particular reference to certain preferred embodiments thereof, but it will be understood that variations and modifications can be effected within the spirit and scope of the invention.

| | |
|---|---|
| 100 | laser thermal (LT) printer system |
| 110 | motion control system |
| 111 | controller |
| 112 | LT station |
| 113 | positional commands |
| 114 | detection system |
| 115 | printhead control commands |
| 116 | multichannel laser printhead |
| 117 | irradiance data |
| 118 | laser light beams |
| 119 | positional data |
| 120 | donor |
| 122 | vacuum chamber |
| 124 | window |
| 126 | chamber wall |
| 128 | window |
| 130 | X-slit aperture |
| 132 | slit |
| 134 | Y-slit aperture |
| 135 | X-attenuator |
| 136 | slit |
| 137 | Y-attenuator |
| 138 | X-photodetector |
| 140 | Y-photodetector |
| 142 | enclosure |
| 144 | CCD camera |
| 200 | exploded view |
| 300 | plot |
| 310 | curve |
| 320 | curve |
| 330 | curve |
| 400 | exploded view |

-continued

| | |
|---|---|
| 500 | plot |
| 510 | ON curve |
| 520 | OFF curve |
| 600 | method of replacing multichannel laser printhead |
| 610 | block |
| 612 | block |
| 614 | block |
| 616 | block |
| 618 | block |
| 620 | block |
| 622 | block |
| 624 | block |
| 626 | block |
| 628 | block |
| 630 | block |
| 632 | block |
| 634 | block |
| 636 | block |
| 638 | block |
| 640 | block |
| 642 | block |
| 644 | block |
| 700 | method of initial setup of a printhead |
| 710 | block |
| 712 | block |
| 714 | block |
| 716 | block |
| 718 | block |
| 720 | block |
| 722 | block |
| 724 | block |
| 726 | block |
| 728 | block |
| 730 | block |
| 732 | block |
| 800 | method of measuring the irradiance profiles of laser light beams |
| 810 | block |
| 812 | block |
| 814 | block |
| 816 | block |
| 817 | block |
| 818 | block |
| 820 | block |
| 822 | block |
| 824 | block |
| 826 | block |
| 828 | block |
| 830 | block |
| 832 | block |
| 834 | block |

What is claimed is:

1. A method of aligning in five degrees of freedom a multichannel laser printhead to be used in thermal transfer of material from a donor to a substrate, comprising:

a) providing a detection system forming a narrow aperture positioned in a plane parallel to the material transfer plane in the donor, a photodetector responsive to laser light passing through the narrow aperture to produce a signal, and further providing a controller adapted to produce a first and second series of laser irradiance profiles;

b) positioning the multichannel laser printhead in x and y directions parallel to the material transfer plane;

c) using a motion control system to sequentially position and scan in a direction perpendicular to the narrow aperture for at least one channel of the multichannel laser printhead and then for at least one other channel of the multichannel laser printhead relative to the aperture from an out-of-focus position through an above focus position so that the controller receives the signals from the photodetector and the motion control system to produce the first and second series of laser irradiance profiles;

d) using the first and second series of laser irradiance profiles to determine correction values needed for roll and yaw of the multichannel laser printhead and distance of the multichannel laser printhead from the material transfer plane;

e) aligning the multichannel laser printhead in accordance with the correction values whereby the multichannel laser printhead is aligned without performing a thermal transfer operation; and f) establishing the x and y coordinates of each channel of the multichannel laser printhead with respect to x and y coordinates of the motion control system.

2. The method of claim 1 further providing an attenuator positioned between the photodetector and the narrow aperture.

3. The method of claim 1 further providing at least three sets of laser irradiance profiles from three different groups of at least one channel of the multichannel laser printhead.

4. The method of claim 1 further providing determining the offset distance between the material transfer plane and the narrow aperture plane and adjusting the position of the multichannel laser printhead in accordance with the offset distance.

5. Apparatus for detecting and aligning in five degrees of freedom a multichannel laser printhead to be used in thermal transfer of material from a donor to a substrate, comprising:

a) a detection system including a narrow aperture positioned in a plane parallel to the material transfer plane in the donor, a photodetector responsive to laser light passing through the narrow aperture to produce signals, and a controller adapted to produce a first and second series of laser irradiance profiles;

b) a motion control system for positioning the multichannel laser printhead in x and y directions parallel to the material transfer plane and including means for adjusting the roll and yaw of the multichannel laser printhead and distance of the multichannel laser printhead from the material transfer plane;

c) the motion control system sequentially positioning and scanning in a direction perpendicular to the narrow aperture for at least one channel of the multichannel laser printhead and then for at least one other channel of the multichannel laser printhead relative to the aperture from an out-of-focus position through an above focus position so that the controller receives signals from the photodetector and the motion control system to produce first and second series of laser irradiance profiles;

d) means for using the first and second series of laser irradiance profiles to determine correction values needed for roll and yaw of the multichannel laser printhead and distance of the multichannel laser printhead from the material transfer plane; and e) establishing the x and y coordinates of each channel with respect to the x and y coordinates of the motion control system.

6. The apparatus of claim 5 further including means for aligning the multichannel laser printhead in accordance with the correction values whereby the multichannel laser printhead is aligned without performing a thermal transfer operation.

7. The apparatus of claim 5 further including an attenuator positioned between the photodetector and the narrow aperture.

8. The apparatus of claim 5 further including providing at least three sets of laser irradiance profiles from three different groups of at least one channel of the printhead.

9. A method for measuring the performance of output of different channels from an aligned multichannel laser printhead to be used in thermal transfer of material from a donor to a substrate, comprising:

a) providing a detection system forming a narrow aperture positioned in a plane parallel to the material transfer plane in the donor, a photodetector responsive to laser light passing through the narrow aperture to produce signals, and further providing a controller adapted to produce a laser irradiance profile;

b) using a motion control system to position the multichannel laser printhead in x and y directions parallel to the material transfer plane and providing means for adjusting the roll and yaw of the multichannel laser printhead and distance of the multichannel laser printhead from the material transfer plane;

c) using the motion control system to sequentially position and scan in a direction perpendicular to the narrow aperture for a plurality of channels of the multichannel laser printhead relative to the aperture in an activated on condition where the channels produce full output laser light above a transfer threshold and in an activated off condition wherein the channels produce output laser light below the transfer threshold so that the controller receives signals from the photodetector and the motion control system to produce a laser irradiance profile showing the variability from channel to channel in the activated on and activated off conditions.

10. The method of claim 9 further providing replacing or correcting the multichannel laser printhead when the laser irradiance profile indicates there is a problem of insufficient channel contrast, irradiance, irradiance uniformity, or channel failure.

11. The method of claim 9 further providing an attenuator positioned between the photodetector and the narrow aperture.

12. The method of claim 9 wherein the multichannel laser printhead includes a modulator, which has two separate drive conditions for polarity states.

13. The method of claim 9 further providing using the information from the laser irradiance profile to define the relationship between multichannel laser printhead output power and laser drive current.

* * * * *